PROCESS FOR SOLDERING SILICON WAFERS TO CONTACTS

Filed Dec. 15, 1967

INVENTOR.
WILLIAM H. TARN
BY
OSTROLENK, FABER, GERB & SOFFEN
ATTORNEYS

United States Patent Office 3,555,669

Patented Jan. 19, 1971

3,555,669

PROCESS FOR SOLDERING SILICON WAFERS TO CONTACTS

William H. Tarn, Culver City, Calif., assignor to International Rectifier Corporation, El Segundo, Calif., a corporation of California Filed Dec. 15, 1967, Ser. No. 690,860
Int. Cl. B01j 17/00; H01l 7/02
U.S. Cl. 29—589 3 Claims

ABSTRACT OF THE DISCLOSURE

A pure aluminum disc is alloyed to an N-type silicon wafer until a silicon-aluminum eutectic is reached, resulting in a soft, gap-free alloy which is readily alloyed to a conductive contact plate.

This invention relates to a novel process for forming an alloy solder on a silicon wafer wherein the alloy is uniformly and intimately bonded over the full surface of the wafer.

The use of an aluminum-silicon eutectic alloy is well known for bonding silicon wafers to copper contacts in forming a semiconductor device. Such solder is commonly available in sheet form, composed of an alloy of 88% aluminum to 12% silicon. A disk of such material is placed between the bottom of the silicon wafer and the top of a copper or molybdenum contact stud, and the system is heated to a temperature of about 700° C. to cause alloying of the disk into the silicon wafer and conductive electrode. The combined disk is then diced to form a plurality of individual units. It has been found that this process gives nonuniform adherence between the adjacent surfaces of the silicon wafer and copper plate, especially around the periphery of the connection. This causes capillary traps between the wafer and contact which retains impurity materials which eventually reach the junction of the wafer to produce excessive leakage at high temperatures. Thus, in the case of thyristors rated at 0.6 ampere, it was found that as temperatures reached 150° C., all voltage capability of the device was lost.

In accordance with the present invention, a pure aluminum disk is used in place of the former alloy with the assemblage of the silicon wafer and solder disk being heated to the eutectic temperature to form a final mixture of 88% aluminum and 12% silicon. That is, the alloy is presoldered to the semiconductor wafer. However, by forming the alloy during the soldering operation, it has been found that there is full surface-to-surface adherence between the wafer and the electrode, so that, after dicing, no capillary traps are formed. Thus, impurities are not trapped, and the likelihood of junction contamination and degraded high temperature operation is decreased. Thereafter, the presoldered wafer is soldered to the molybdenum disk.

Accordingly, a primary object of this invention is to improve the adherence of a silicon wafer to a conductive electrode plate.

A further object of this invention is to improve the temperature characteristics of a semiconductor device.

Another object of this invention is to decrease the possibility of trapping impurities between a semiconductor wafer and contact plate therefor.

These and other objects of this invention will become apparent from the following description when taken in connection with the drawings in which.

Figure 1:
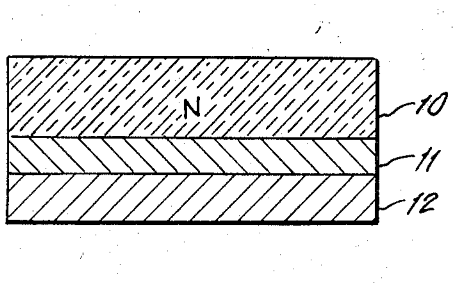
FIG. 1 shows a cross-sectional view of a silicon wafer, a solder disk, and a conductive contact plate.
Figure 2:
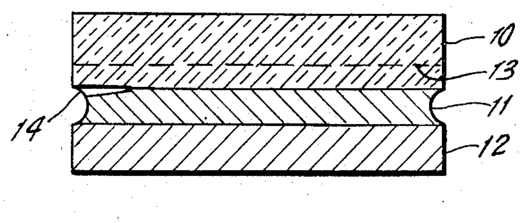
FIG. 2 shows the device of FIG. 1 after alloying.
Figure 3:
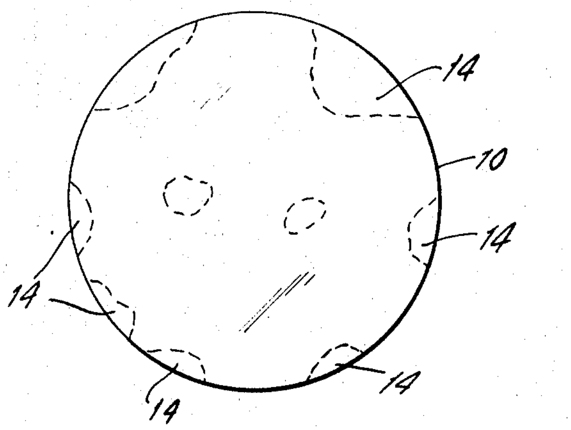
FIG. 3 is a top view of FIG. 2, and illustrates the existence of capillary traps when using prior art soldering techniques.

Referring now to FIG. 1, and in accordance with prior art techniques, a monocrystalline silicon wafer 10 of the N-type having a diameter of 1 inch and a thickness of 15 mils is suitably prepared for alloying, and is stacked atop solder wafer 11 and molybdenum expansion plate 12. Solder wafer 12 is an alloy of 88% aluminum and 12% silicon, and has a thickness of about 2 mils. The assemblage is then heated to about 700° C., causing alloying into wafer 10, to form junction 13, and to mechanically connect wafer 10 and plate 12. This process has been found to leave capillary gaps, such as gaps 14 (FIGS. 2 and 3) between solder 11 and wafer 10 which traps impurities which ultimately reach junction 13 and prevent high temperature operation.

Figure 4:
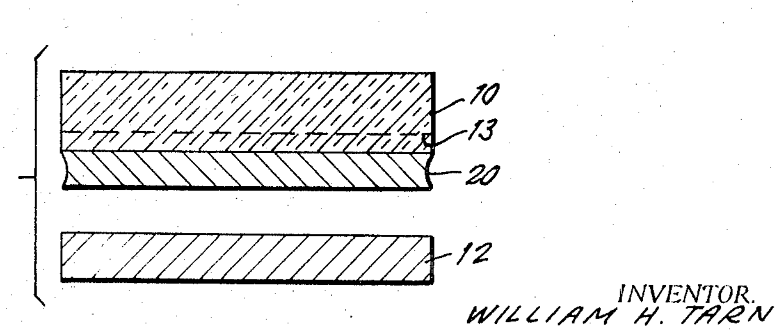
FIG. 4 is a cross-sectional view of an assemblage processed in accordance with the invention.

In accordance with the invention and as shown in FIG. 4., a pure aluminum disk 20 is prealloyed to wafer 10 to form junction 13 and to reach the eutectic point of the silicon-aluminum system. This has proven to form a gap-free bond over the full surface-to-surface contact of wafer 10 and disk 20, with the disk 20 readily dissolving the molybdenum plate 12 during subsequent alloying to secure plate 12 to wafer 10.

More particularly, and in carrying out an example of the invention, disk 20 was a pure aluminum disk having a thickness of 2 mils, and a diameter equal to the diameter of wafer 10 (1 inch). The two were then held together and heated to a temperature above the eutectic temperature of the aluminum-silicon system (577° C.) and in particular was heated from room temperature to 650° C. in about 20 minutes. After reaching 650° C., the temperature was reduced toward the eutectic temperature of 577° C. at a rate of about 5° C. per minute. The assembly was then permitted to cool to room temperature, and is then diced, as by acid etching, and the individual dies were connected to suitable molybdenum or copper electrodes by alloying of the alloy plate 20 into the contact surface.

Devices formed in this way have been found to have improved high temperature characteristics by virtue of eliminating impurity traps on the wafer edge.

Although this invention has been described with respect to its preferred embodiments, it should be understood that many variations and modifications will now be obvious to those skilled in the art and it is preferred, therefore, that the scope of the invention be limited not by the specific disclosure herein, but only by the appended claims.

The embodiments of the invention in which an exclusive privilege or property is claimed are defined as follows:

1. The process of forming a P–N junction and simultaneously connecting a solder plate to an N-type monocrystalline silicon wafer comprising the steps of: placing a pure aluminum wafer over the full surface of said silicon wafer, heating said silicon wafer and pure aluminum wafer to a temperature above the eutectic temperature of a silicon-aluminum alloy, and thereafter decreasing said temperature to said eutectic temperature at a controlled rate of about 5° C./minute to form an aluminum-silicon alloy of about 88% aluminum by weight to 12% silicon by weight at at least the interface between said silicon wafer and pure aluminum wafer which is free of voids.

2. The process of claim 1 in which said wafers are first heated to a temperature of about 650° C. and are then cooled to a temperature of about 577° C. at said 5° C/ minute rate.

3. The process of claim 2 in which said temperature of about 650° C. is reached from room temperature in about 20 minutes.

References Cited

UNITED STATES PATENTS

| | | | |
|---|---|---|---|
| 2,987,816 | 6/1961 | Noldan | 29—501X |
| 3,110,849 | 11/1963 | Soltys | 29—589 |
| 3,200,490 | 8/1965 | Clymer | 29—589 |
| 3,233,309 | 2/1966 | Emeis | 29—501X |
| 3,375,143 | 3/1968 | Garner et al. | 29—501X |

JOHN F. CAMPBELL, Primary Examiner

W. TUPMAN, Assistant Examiner

U.S. Cl. X.R.

29—487